(12) United States Patent  (10) Patent No.: US 8,174,175 B2
Yamamoto  (45) Date of Patent: May 8, 2012

(54) LIGHT-EMITTING DEVICE AND METHOD FOR MANUFACTURING SAME

(75) Inventor: Kazuto Yamamoto, Mizuho-machi (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/179,686

(22) Filed: Jul. 25, 2008

(65) Prior Publication Data

US 2009/0026469 A1 Jan. 29, 2009

(30) Foreign Application Priority Data

Jul. 27, 2007 (JP) ................................. 2007-195881

(51) Int. Cl.
    *H01J 29/10* (2006.01)
(52) U.S. Cl. .......................................... 313/463; 257/98
(58) Field of Classification Search .................... 257/98; 313/463
    See application file for complete search history.

(56) References Cited

U.S. PATENT DOCUMENTS

| | | | |
|---|---|---|---|
| 5,640,067 A | 6/1997 | Yamauchi et al. | |
| 6,133,692 A | 10/2000 | Xu et al. | |
| 6,366,017 B1* | 4/2002 | Antoniadis et al. | 313/506 |
| 6,384,427 B1* | 5/2002 | Yamazaki et al. | 257/59 |
| 6,737,800 B1 | 5/2004 | Winters et al. | |
| 6,774,574 B1* | 8/2004 | Koyama | 315/169.3 |
| 6,787,976 B2 | 9/2004 | Minoura et al. | |
| 6,831,409 B2* | 12/2004 | Yamada | 313/506 |
| 6,965,197 B2* | 11/2005 | Tyan et al. | 313/506 |
| 7,554,265 B2* | 6/2009 | Godo et al. | 313/506 |
| 7,750,557 B2 | 7/2010 | Takahashi | |
| 7,888,856 B2 | 2/2011 | Yaegashi | |
| 2002/0079835 A1 | 6/2002 | Lee | |
| 2004/0105047 A1 | 6/2004 | Kato | |

(Continued)

FOREIGN PATENT DOCUMENTS

EP  1 403 939 A1  3/2004

(Continued)

OTHER PUBLICATIONS

U.S. Appl. No. 12/137,021; Filed: Jun. 11, 2008; First Named Inventor: Kazuto Yamamoto; Title: "Display Apparatus and Method of Manufacturing the Same".

(Continued)

*Primary Examiner* — David Vu
*Assistant Examiner* — Brandon Fox
(74) *Attorney, Agent, or Firm* — Holtz, Holtz, Goodman & Chick, PC

(57) ABSTRACT

The light-emitting device of the present invention is a light-emitting device having a plurality of pixels that comprises a light-emitting function layer of at least one layer that emits light in accordance with a supplied current, a first electrode layer of a conductive material provided at one surface of the light-emitting function layer, and being transparent to at least part of a wavelength range of light emitted from the light-emitting function layer, a second electrode layer provided facing the first electrode layer on the other surface of the light-emitting function layer, including conductive material, and being transparent to at least part of the wavelength range of light emitted from the light-emitting function layer, and a reflecting layer provided on the second electrode layer, and being reflective to at least part of the wavelength range of light emitted from the light-emitting function layer.

6 Claims, 11 Drawing Sheets

U.S. PATENT DOCUMENTS

| | | |
|---|---|---|
| 2004/0211971 A1 | 10/2004 | Takei et al. |
| 2005/0225232 A1 | 10/2005 | Boroson et al. |
| 2006/0138945 A1 | 6/2006 | Wolk et al. |
| 2006/0208632 A1* | 9/2006 | Kang ............................ 313/503 |
| 2006/0244369 A1 | 11/2006 | Eiichi |
| 2007/0015429 A1 | 1/2007 | Maeda et al. |
| 2007/0126353 A1 | 6/2007 | Kubota et al. |
| 2007/0290213 A1 | 12/2007 | Kobayashi |
| 2008/0309232 A1 | 12/2008 | Yamamoto |
| 2010/0026180 A1 | 2/2010 | Kobayashi |
| 2010/0136220 A1 | 6/2010 | Kitazume |

FOREIGN PATENT DOCUMENTS

| | | |
|---|---|---|
| JP | 8-330600 A | 12/1996 |
| JP | 2003-229283 A | 8/2003 |
| JP | 2004-014385 A | 1/2004 |
| JP | 2004-253389 A | 9/2004 |
| JP | 2005-222759 A | 8/2005 |
| JP | 2006-244713 A | 9/2006 |
| JP | 2006-278128 A | 10/2006 |
| WO | WO 2005/094134 A1 | 10/2005 |
| WO | WO 2005/101541 A1 | 10/2005 |
| WO | 2006/035596 A1 | 4/2006 |

OTHER PUBLICATIONS

Japanese Office Action dated Jan. 4, 2012 (and English translation thereof) in counterpart Japanese Application No. 2007-195881.

\* cited by examiner

| | VIEWING ANGLE θ | 0° | 20° | 40° | 60° | 80° |
|---|---|---|---|---|---|---|
| COMPUTATIONAL MODEL A | CIE(X) | 0.136551 | 0.138338 | 0.1142745 | 0.136805 | 0.139855 |
| | CIE(Y) | 0.182073 | 0.169615 | 0.167964 | 0.183932 | 0.158204 |
| COMPUTATIONAL MODEL B | CIE(X) | 0.136972 | 0.136199 | 0.135659 | 0.137208 | 0.138867 |
| | CIE(Y) | 0.223211 | 0.21458 | 0.191972 | 0.169921 | 0.160972 |

LIGHT-EMITTING DEVICE AND METHOD FOR MANUFACTURING SAME

BACKGROUND OF THE INVENTION

1. Field of the Invention

The present invention relates to a light-emitting device equipped with light-emitting elements at pixels and a method for manufacturing the light-emitting device, and particularly relates to a light-emitting device equipped with organic electroluminescent elements at light-emitting elements and a method for manufacturing the light-emitting device.

2. Description of the Related Art

In recent years, research and development into making widespread use of display devices equipped with light-emitting element-type display panels where display pixels having light-emitting elements such as organic electroluminescence elements (hereinafter abbreviated to "organic EL elements"), or light-emitting diodes (LEDs) arrayed two-dimensionally, or light-emitting devices where pixels having light-emitting elements arranged in a plurality a reality as the next generation of display devices superseding liquid crystal displays devices (LCD'S) has been making considerable progress.

With organic EL elements used in light-emitting element-type display devices and light-emitting devices, for example, an organic layer including a light-emitting layer is sandwiched between a reflecting electrode and a transparent electrode. Light emitted from the light-emitting layer is then reflected by the reflecting electrode. The light is then emitted from the transparent electrode side and an image is displayed. At the organic EL element of this structure, when light is outputted from the light-emitting layer towards the transparent electrode, the light from the light-emitting layer is outputted to the reflecting electrode side and reflected so as to give light outputted in the direction of the transparent electrode. There is therefore the fear that interference effects will occur with this light. For example, it is possible that the hue will change due to the angle of visibility.

The light interference effects are caused by peaks differing depending on the wavelength of the light. Positions of the peaks then shift depending on the light-emitting position of the light-emitting layer. When there are variations in the thickness of the light-emitting layer, the position of emitted light changes. This causes variation in the radiation intensity and chromaticity.

With the light emitted from the organic EL element, light is also emitted in an oblique direction in addition to the light emitted from the front surface of the organic EL element. Light emitted in the oblique direction has a different path length to light emitted from the front surface. Different interference effects are therefore incurred and dependence on the angle of visibility is therefore feared.

SUMMARY OF THE INVENTION

The present invention is advantageous in providing a light-emitting device having superior display characteristics and a method for manufacturing the light-emitting device where, in a light-emitting device equipped with a plurality of pixels having light-emitting elements, shifts in chromaticity and variation in radiation intensity, and changes in chromaticity due to the angle of visibility are suppressed.

In order to achieve the above advantages, the light-emitting device of the present invention is a light-emitting device having a plurality of pixels that comprises a light-emitting function layer of at least one layer that emits light in accordance with a supplied current, a first electrode layer of a conductive material provided at a one surface side of the light-emitting function layer, and being transparent to at least part of a wavelength range of light emitted from the light-emitting function layer, a second electrode layer provided facing the first electrode layer on the other surface of the light-emitting function layer, including conductive material, and being transparent to at least part of the wavelength range of light emitted from the light-emitting function layer, and a reflecting layer provided on the second electrode layer, and being reflective to at least part of the wavelength range of light emitted from the light-emitting function layer.

In order to obtain the above advantages, a method for manufacturing a light-emitting device of the present invention is a method for manufacturing the light-emitting device having a plurality of pixels having a light-emitting function layer of at least one layer comprising the steps of forming a first electrode layer using conductive material being transparent to at least part of a wavelength range of light emitted from the light-emitting function layer, forming the light-emitting function layer on the first electrode layer, forming a second electrode layer on the light-emitting function layer facing the first electrode layer using material including at least conductive material being transparent to at least part of a wavelength range of light emitted from the light-emitting function layer, and forming a reflecting layer on the second electrode layer using a material being reflective to at least part of a wavelength range of light emitted from the light-emitting function layer.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Figure 1:
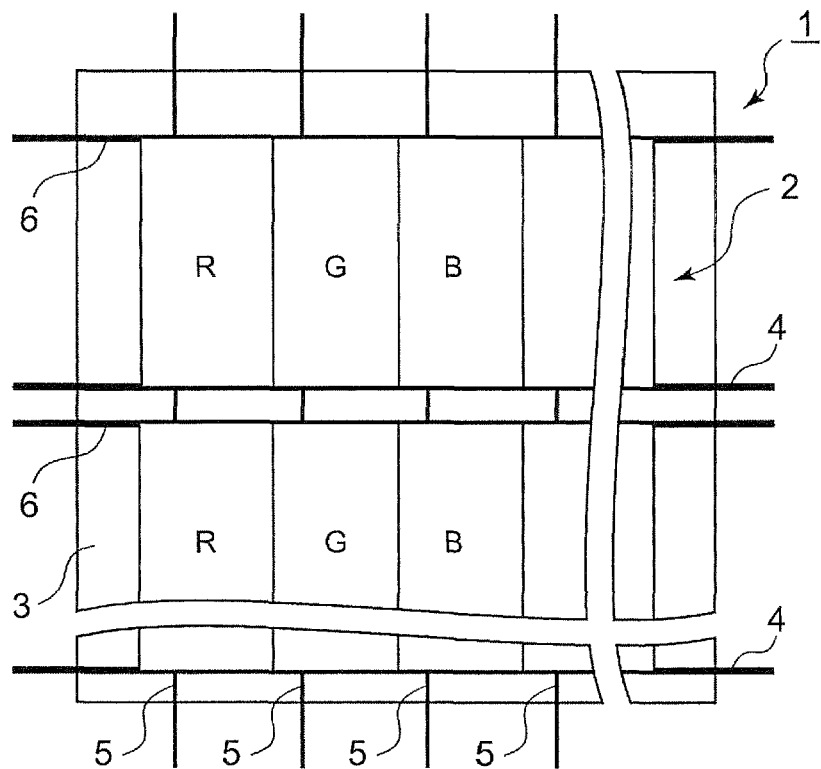
FIG. 1 is a diagram showing an example outline of a pixel array for a light-emitting device of a first embodiment of the present invention.

The following is a detailed description of a light-emitting device of the present invention based on exemplary embodiments shown in the drawings.

First Embodiment

First, a description is given of a first embodiment of the present invention.

FIG. 1 is a diagram showing an example outline of a pixel array for a light-emitting device 1 of the first embodiment of the present invention.

As shown in FIG. 1, the light-emitting device 1 includes pixels 2, cathode area 3, anode lines 4, data lines 5, and select lines 6.

The pixels 2 have organic EL elements (OLED: Organic Light Emitting Diodes) as light-emitting elements. The light-emitting device 1 has a plurality of pixels 2 arrayed two-dimensionally so as to constitute a display device that displays images, for example.

With the light-emitting device 1 of this embodiment, as shown in FIG. 1, three colors of red (R), green (G) and blue (B) are grouped together for each pixel 2. A plurality of such groups are then repeatedly arrayed in a row direction (lateral direction in FIG. 1). Pluralities of pixels 2 of the same color are then arrayed in a column direction (vertical direction in FIG. 1).

The cathode area 3 is a single electrode layer provided to straddle each pixel 2 and is a common cathode for each pixel 2. The anode lines 4 are wiring for supplying current to each pixel 2 connected to a power supply voltage. The data lines 5 provide gradation signals to the pixels 2 of each column. The select lines 6 select each row, and gradation signals from the data lines 5 are supplied to the pixels 2 of selected rows.

Figure 2:
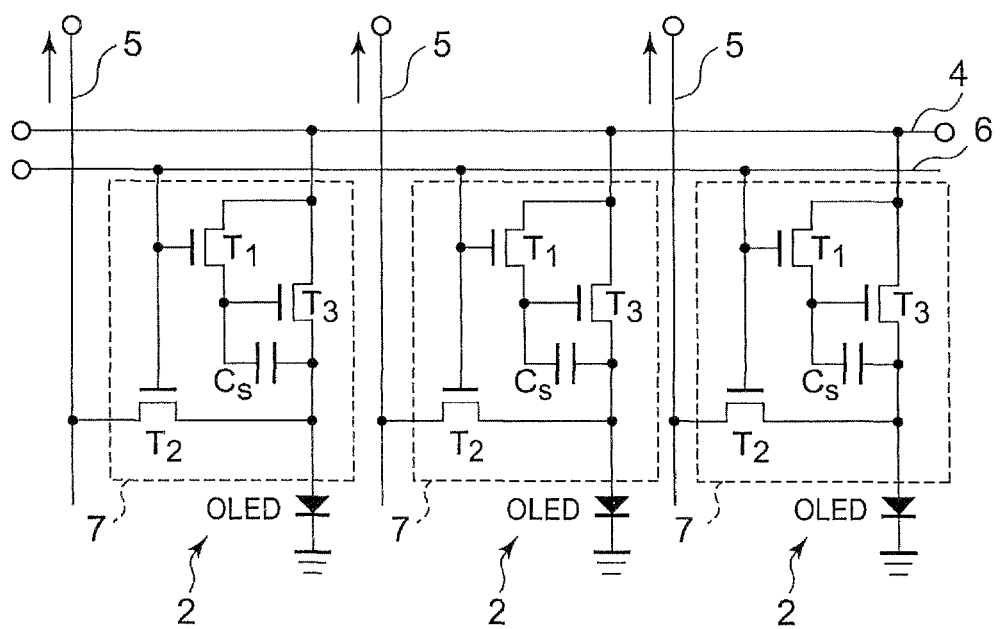
FIG. 2 is a diagram showing an example pixel circuit configuration for each pixel.

FIG. 2 is a diagram showing an example pixel circuit configuration for each pixel 2.

As shown in FIG. 2, each pixel 2 has a circuit configuration including a pixel drive circuit 7 having a TFT (Thin Film Transistor) etc., and an OLED (organic light emitting diode) emitting light as a result of current controlled by the pixel drive circuit 7. The light-emitting device 1 of this embodiment is an active-drive type light-emitting device where TFTs are arranged at each pixel 2 that drives the organic light-emitting diodes.

As shown in FIG. 2, the pixel drive circuit 7 includes TFT transistors $T_1$ to $T_3$, and a capacitor Cs.

At the transistors $T_1$ to $T_3$, the gate electrodes can be, for example, aluminum nadium titanium or chrome (Cr), and the source/drain electrodes can be aluminum titanium/Cr, AlNdTi/Cr, or Cr. It is preferable for the source/drain electrodes to be AlTi/Cr or AlNdTi/Cr from the point of view of the height of the conductivity and adhesiveness with a silicon nitride (SiN) film. In this embodiment, the source/drain electrodes and the select lines 6/anode lines 4 are comprised of AlTi/Cr or AlNdTi/Cr.

It is also possible to lower wiring resistance by overlaying metal wiring such as AlTi/Cr, AlNdTi/Cr, Cr, or Copper (Cu) on the wiring for the select lines 6/anode lines 4.

The capacitor Cs can be a parasitic capacitance formed across the gate and source of the transistor $T_3$, an auxiliary capacitance additionally provided across the gate and source, or a capacitance component composed of both the parasitic capacitance and the auxiliary capacitor.

In this embodiment, the select lines 6/anode lines 4 are at the same layer as the source/drain electrodes and can therefore, for example, be formed at the same time.

The data lines 5 are at the same layer as the gate electrodes and can therefore, for example, be formed at the same time.

In the above, the pixel drive circuit 7 adopts a configuration having three TFTs. This is, however, by no means limiting and a configuration of two TFTs or a configuration having four or more TFTs is also possible.

Figure 3:
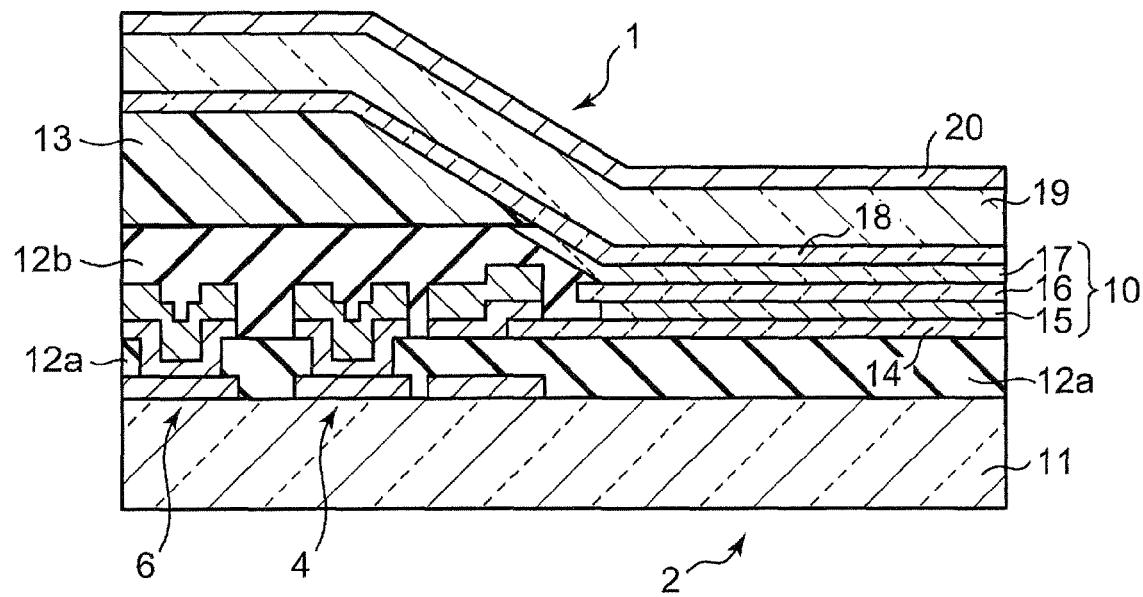
FIG. 3 is a diagram showing a cross-sectional view of the essential parts of the light-emitting device of the first embodiment.

FIG. 3 shows the cross-sectional structure of the light-emitting device 1 of this embodiment.

The light-emitting device 1 of this embodiment is a bottom emission-type light-emitting device that displays by emitting light downwards (below a substrate 11) in FIG. 3.

As shown in FIG. 3, the light-emitting device 1 includes the substrate 11. The substrate 11 is a substrate comprised of transparent material and is, for example, a glass substrate.

An insulating film 12a is formed on the regions for forming the pixels 2 (pixel region) on the substrate 11. Further, the select lines 6 and the anode lines 4 are arranged in the vicinity of the pixel region on the substrate 11, with the insulating film 12a then being formed at the periphery. An insulating film 12b (inter-layer insulating film) is formed so as to cover the select lines 6 and the anode lines 4. The insulating films 12a, 12b are formed, for example, from $SiO_2$ and SiNx, with SiN being used in this embodiment.

A bank layer 13 is formed on the insulating film 12b so as to cover the select lines 6 and the anode lines 4. The bank layer 13 functions as a partition wall (bank) during application of organic electroluminescent material to the pixel regions and is a photosensitive resin such as, for example, polyimide resin. The bank layer 13 is surface-processed so as to have liquid-repellent properties with respect to organic compound-containing liquid applied to the pixel regions as described later. Here, the liquid-repellent property refers to a property of repelling an organic compound solution. Having this property, an article receives a drop of an organic compound by an angle greater than a certain degree, when it is dropped on the surface.

A transparent anode electrode (first electrode layer, pixel electrode) 14 that functions as an anode electrode is formed on the insulating film 12a formed on the pixel regions.

A light-emitting function layer 10 for the organic electroluminescent element is formed on the transparent anode electrode 14. The light-emitting function layer 10 includes a hole injection layer 15, an inter-layer 16, and a light-emitting layer 17. When current is supplied from outside, the light-emitting function layer 10 emits light according to the value of the current. The light-emitting function layer 10 is not limited to the hole injection layer, inter-layer, and light-emitting layer of this embodiment. For example, it is possible to omit the inter-layer.

An electron transporting layer 18 is formed on the light-emitting layer 17. A thin-film transparent electrode layer 19 (a part of second electrode layer) functioning as a cathode electrode for the organic electroluminescent element is formed on the electron transporting layer 18. Reflecting metal 20 is then formed as a reflecting layer on a thick-film transparent electrode layer 19.

The transparent anode electrode 14 is formed on the insulating film 12a, is transparent to at least part of the wavelength range of the light emitted by the light-emitting function layer 10, and is constituted by a transparent conductive layer such as indium tin oxide (ITO). ITO can typically be used as a transparent anode electrode 14 but this is by no means limiting and publicly known transparent conductive material can also be used. The transparent anode electrode 14 is surface-processed so as to have lyophilic properties with respect to an organic compound-containing liquid applied to the pixel region as described later.

The hole injection layer 15 is formed on the transparent anode electrode 14. The hole injection layer 15 has a function for increasing hole injection efficiency from the transparent anode electrode 14. A material with high hole mobility that reduces the injection partition wall from the transparent anode electrode 14 can be used for the hole injection layer 15.

The inter-layer 16 is formed on the hole injection layer 15. Namely, the inter-layer 16 is formed between the hole injection layer 15 and the light-emitting layer 17. The inter-layer 16 has a function for blocking electrons from moving to within the light-emitting layer 17 and acts to increase the likelihood of recombination of electrons and holes (positive holes) within the light-emitting layer 17. A material with high hole mobility having an electron blocking function can be used for the inter-layer 16.

The light-emitting layer 17 is formed on the inter-layer 16. The light-emitting layer 17 has a function for generating light by applying a predetermined voltage across the transparent anode electrode 14 and the thick-film transparent electrode layer 19. A material capable of fluorescence or phosphorescence such as, for example, a well-known high-polymer material can be used as the light-emitting layer 17.

In this embodiment, the hole injection layer 15, the inter-layer 16, and the light-emitting layer 17 are formed by applying material to the pixel regions using nozzle coating techniques or ink jet techniques. The hole injection layer 15, the inter-layer 16 and the light-emitting layer 17 include materials that can be normally used capable of exhibiting the functions of each layer that can be formed using organic compound-containing liquid capable of forming the material of these layers using nozzle coating techniques and ink jet techniques.

An aqueous solution of PEDOT/PSS that is a dispersion fluid where, for example, a conductive polymer of polyethylenedioxythiophene (PEDOT) and a dopant of polystyrene sulphonic acid (PSS) are dispersed in a water-based solvent can be taken as the organic compound-containing liquid including organic polymer hole injection/transporting material.

Further, a solution (dispersion fluid) where light-emitting material for red (R), green (G), and blue (B) including a conjugated double-bond polymer such as polyparaphenylene vinyl, or polyfluorene is dissolved (or dispersed) in an appropriate water-based solvent or organic solvent such as tetrahydronaphthalene, tetramethylbenzene, mesitylene, or xylene can be taken as an organic compound-containing liquid including organic polymer electron transporting light-emitting material.

The electron transporting layer 18 is formed on the light-emitting layer 17 and covers the bank layer 13. The electron transporting layer 18 is also formed so as to span each pixel 2 at a region corresponding to the cathode area 3 shown in FIG. 1.

The electron transporting layer 18 increases the efficiency with which electrons are injected to the light-emitting layer 17 and has a hole-blocking function. An alkaline earth metal such as, for example, Mg, Ca, or Ba or an oxide or metal alloy thereof can be used as the electron transporting layer 18. In this embodiment, Ca can be used as a material that is highly resistant to oxygen employed in sputtering from forming the thick-film transparent electrode layer 19 using sputtering techniques.

The thick-film transparent electrode layer 19 is formed on the electron transporting layer 18 at a region corresponding to the cathode area 3 shown in FIG. 1 together with each of the pixels 2 and functions as a common cathode electrode at each pixel 2. Namely, the thick-film transparent electrode layer 19 is formed between the light-emitting layer 17 (electron transporting layer 18) and the reflecting metal 20. The thick-film transparent electrode layer 19 is transparent with respect to the wavelength range of at least part of the light emitted by the light-emitting function layer 10.

The thick-film transparent electrode layer 19 of this embodiment has a single layer structure and constitutes a single electrode layer corresponding to the cathode area 3 shown in FIG. 1.

The thick-film transparent electrode layer 19 has a function that suppresses variation in radiation intensity and chromaticity. The thick-film transparent electrode layer 19 subjects light emitted by the light-emitting layer 17 to interference effects using multiple reflections and has a function for suppressing peak shifts of interference effects occurring due to variations in the thickness of the light-emitting layer 17 and peak shifts in radiance due to this effect by causing interference peaks to be generated so as to span a broad range. It is therefore possible to suppress variation in the chromaticity and radiation intensity and it is possible to suppress dependence on the angle of visibility. The details are described in the following.

A material that is transparent with respect to at least part of the wavelength range of the light emitted by the light-emitting function layer 10 and that has conductance can be used as the material constituting the thick-film transparent electrode layer 19.

Specifically, for example, an oxide conduction film such as ITO (Indicum Tin Oxide), Indium Zinc Oxide, Indium Tungsten Oxide, or Indium Tungsten Zinc Oxide) etc. can be used. The thick-film transparent electrode layer 19 can be formed using sputtering techniques as described above.

The thick-film transparent electrode layer 19 is preferably 800 nm to 1500 nm thick, or still more preferably 1000 nm to 1500 nm thick. This is because it is possible to sufficiently suppress variation in chromaticity and radiation intensity by making the thickness of the thick-film transparent electrode layer 19 1000 nm or more. Further, a thickness of more than 1500 nm is not desirable because film-forming takes much longer and there is the fear that transparency will fall when thicker than 1500 nm.

The reflecting metal 20 is formed on the thick-film transparent electrode layer 19. The reflecting metal 20 is preferably capable of completely reflecting visible light and is formed of a material and to a film thickness that is capable of completely reflecting visible light. The light-emitting device 1 (organic EL element) of this embodiment differs from usual bottom emitter-type organic EL elements in that the role of the cathode electrode is taken on by the thick-film transparent electrode layer 19. The reflecting metal 20 is preferably a metal with high reflectance to visible light such as Ag, AlNdTi, or Al.

Light is then emitted at the light-emitting device 1 (organic EL element) according to the amount of current flowing at the light-emitting layer 17 by applying a prescribed voltage across the transparent anode electrode 14 and the thick-film transparent electrode layer 19. The generated light is then taken out directly via the transparent anode electrode 14 from the light-emitting layer 17 or light reflected once at the reflecting metal 20 is taken out indirectly via the side of the transparent anode electrode 14.

In this embodiment, the thick-film transparent electrode layer 19 is provided between the light-emitting layer 17 and the reflecting metal 20. It is therefore possible to suppress variation in the chromaticity and the radiation intensity and to suppress dependence on the angle of visibility.

A description is now given in the following of a computational model illustrating a method for suppressing dependence on the angle of visibility in the present invention.

Figure 4:
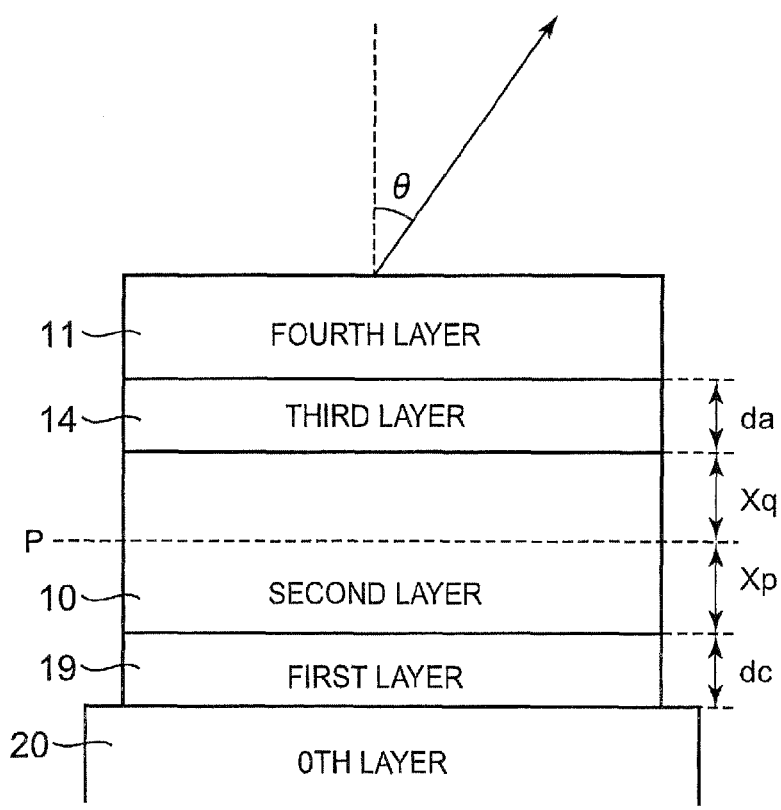
FIG. 4 is a diagram showing a computational model A corresponding to the configuration of the present invention.

FIG. 4 is a diagram showing a computational model A corresponding to a configuration for the present invention in order to illustrate the structure and effects of the present invention.

As shown in FIG. 4, this computational model A is an organic EL element including the reflecting metal 20, the thick-film transparent electrode layer 19, the light-emitting function layer 10, the transparent anode electrode 14, and the glass substrate 11. Here, the electron transporting layer 18 provided between the light-emitting function layer 10 and the thick-film transparent electrode layer 19 is extremely thin and is omitted from the computational model A due to having a negligible effect optically.

In the diagram of the computational model A shown in FIG. 4, the vertical direction is reversed to that of FIG. 3 for ease of description. In the computational model A, the light emitted by the organic EL is taken to start from one point (radiation point P: specifically one point within the light-emitting layer 17) within the light-emitting function layer 10. In the calculations, film thickness from the radiation point P to the thick-film transparent electrode layer 19 is taken to be Xp, film thickness from the radiation point P to the transparent anode electrode 14 is taken to be Xq, and film thickness of the thick-film transparent electrode layer 19 is taken to be dc. Film thickness of the transparent anode electrode 14 is taken to be da, and the thicknesses of the reflecting metal 20 and the glass substrate 11 are taken to be infinite.

Figure 5:
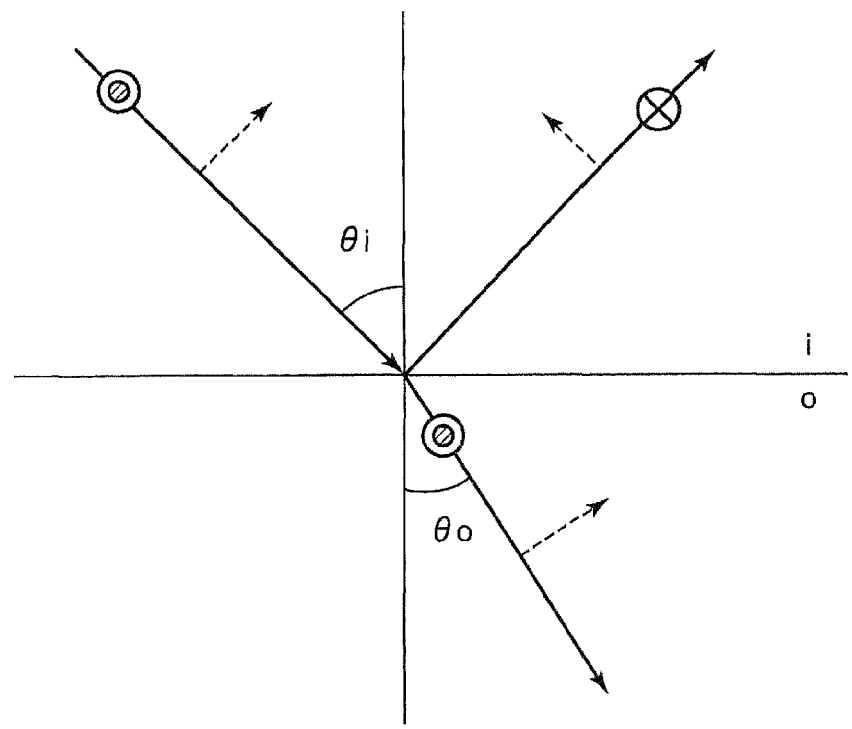
FIG. 5 is a diagram showing a positive direction for amplitude of incident light, reflected light, and transmitted light.

FIG. 5 is a diagram showing a positive direction for amplitude of incident light, reflected light, and transmitted light.

When light is incident from a medium i (refractive index $n_i$) to a medium o (refractive index $n_o$), a positive direction of polarized light (s-polarized) of an electric field oscillating perpendicularly to the incident surface is in the direction of the arrows (dashed lines) in FIG. 5. Further, a positive direction of polarized light (p-polarized) for an electric field oscillating within the surface of incidence is a direction perpendicular to FIG. 5 as shown in FIG. 5.

An amplitude reflectance $r_{i,o}$ at each boundary surface and a transmission amplitude rate $t_{i,o}$ are then respectively:

$$r_{i\text{-}o} = \frac{Y_o - Y_i}{Y_o + Y_i} \qquad \text{Equation 1}$$

$$t_{i\text{-}o} = \frac{2(Y_o Y_i)^{1/2}}{Y_o + Y_i}\left(\frac{\cos\theta_i}{\cos\theta_o}\right)^{1/2}$$

Here, $\theta_i$ is the angle of incidence, the reflection angle, and $\theta_o$ is the angle of refection.

Further, in the case of s-polarized light, $Y_i$ and $Y_o$ are denoted by:

$Y_i = n_i \cos\theta_i$, $Y_o = n_0 \cos\theta_0$

In the case of p-polarized light, this becomes:

$Y_i = n_i/\cos\theta_i$, $Y_o = n_0/\cos\theta_0$

Figure 6:
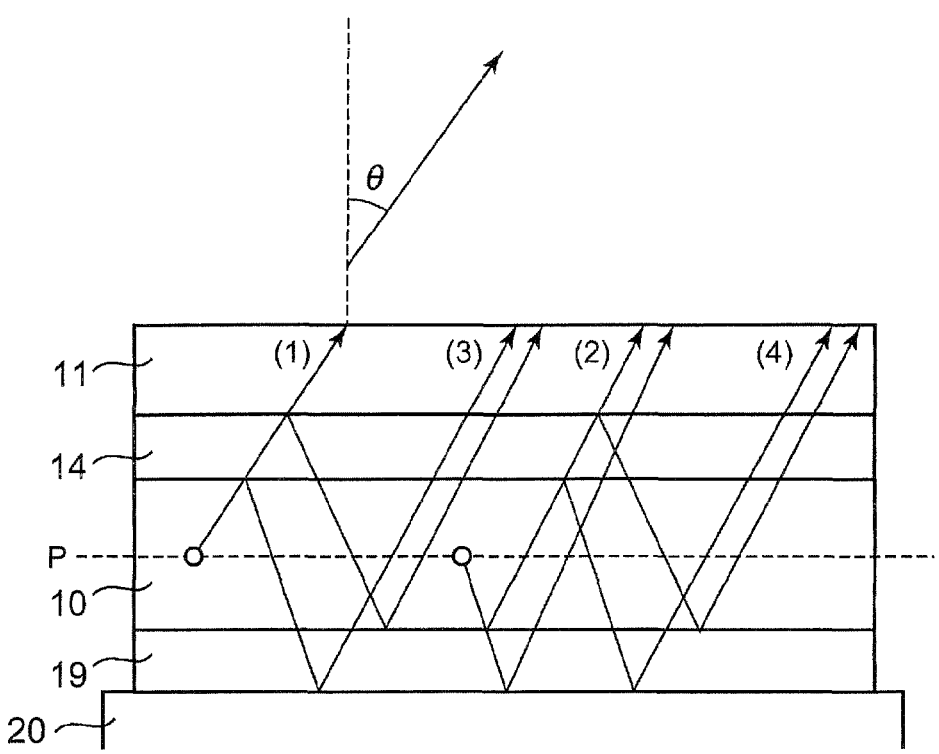
FIG. 6 is a diagram showing a light path of the computational model A of the present invention.

FIG. 6 is a diagram showing a light path of the computational model A of the present invention.

As shown in FIG. 6, light emitted from the radiation point P of the light-emitting function layer 10 is emitted to outside of the glass substrate 11 via light paths (1) to (4). Spectroscopic intensity $I(\lambda)$ (corresponding to the interference effects) in a direction of angle θ of light emitted in this manner can be expressed by the following equation.

$I(\lambda) = \text{Abs}[\{t_{2,4}\{1 - r_{2,0}\exp(i\gamma_p)\} + r_{2,4}r_{2,0}t_{2,4}\exp(i\gamma_{p+q})\}\{1 - r_{2,4}\exp(i\gamma_p)\}/\sqrt{2}\}]^2$ In this equation, the reflecting metal 20 is the "0th layer", the thick-film transparent electrode layer 19 is the "first layer", the light-emitting function layer 10 is the "second layer", the transparent anode electrode 14 is the "third layer", and the glass substrate 11 is the "fourth layer". For example, $t_{2,4}$ indicates the transmission amplitude rate for transmittance from the second layer to the fourth layer.

The spectroscopic intensity $I(\lambda)$ calculated using the above equation corresponds to a multiple reflection model and indicates a ratio every wavelength λ of intensity of light emitted to outside with respect to the intensity (amplitude) of light emitted isotropically from the light-emitting layer 17 and indicates interference effects due to multiple reflections. The values obtained in this way are relative values taking the intensity (amplitude) of light of each wavelength of the emitted light as a reference. At each wavelength, the intensity of light emitted to outside being the same as the intensity of light emitted from the light-emitting layer 17 is normalized as "1", the light emitted from the light-emitting layer 17 being reinforced by light emitted to outside as a result of interference so that the intensity of light emitted to outside is twice the intensity of light emitted from the light-emitting layer 17 is taken normalized as "2", and light emitted to outside as a result of interference and light emitted from the light-emitting layer 17 negating each other so as to give an intensity of zero is taken to be "0".

It is then possible to obtain the spectroscopic intensity of each wavelength by obtaining the respective spectroscopic intensities for the s-polarized light and the p-polarized light from this equation and then averaging the obtained values.

Here, this can be expressed by:

$r_{2,4} = r_{2,3} + t_{2,3}t_{3,2}r_{3,4}\exp(i\gamma_c)$ $t_{2,4} = t_{2,3}t_{3,4}\exp(-i\gamma_c/2)$ $r_{2,0} = r_{2,1} + t_{2,1}t_{1,2}r_{1,0}\exp(i\gamma_a)$ Phase difference Y can then be expressed by:

$\gamma_a = 4\pi n_1 da \cos\theta_1/\lambda$ $\gamma_c = 4\pi n_3 dc \cos\theta_3/\lambda$ $$\gamma_p = 4\pi n_2 Xp \cos\theta_2/\lambda$$

$$\gamma_{p+q} = 4\pi n_2 (Xp+Xq)\cos\theta_2/\lambda$$

Here, $\theta_m$ is obtained using Snell's law so using nm sin $\theta_m$=sin $\theta$(m=layer number, $\theta$=viewing angle).

Further, the refractive indexes of the third layer (transparent anode electrode 14), the second layer (light-emitting function layer 10), and the fourth layer (glass substrate 11) are close. The influence of reflections is therefore considered to be small and is calculated as $r_{2,3}$, $r_{3,4}$=0. Further, this is calculated as $\theta$=0, da=200, Xp=50, Xq=60~80, dc=1000.

Next, light emitted from the light-emitting function layer 10 is defined and radiance $Le(\lambda)$ before interference can be calculated using:

$$Le(\lambda)[W/sr*m^2] = \begin{bmatrix} \dfrac{1/\exp\left(\dfrac{1}{2}\left(\dfrac{\lambda_p-\lambda}{\sigma}\right)^2\right) \cdot \sigma^2}{((\lambda_p-\lambda)^2+\sigma^2)} \end{bmatrix}^{\lambda_a} \quad (\lambda_p-\lambda \geq 0) \begin{bmatrix} \dfrac{1/\exp\left(\dfrac{1}{2}\left(\dfrac{\lambda_p-\lambda}{\sigma}\right)^2\right)}{1} \end{bmatrix}^2 \cdot$$

$$\dfrac{\sigma^2}{((\lambda_p-\lambda)^2+\sigma^2)}(\lambda_p-\lambda<0)$$

Equation 2

Here, $\lambda_p$ is peak wavelength of the light-emitting layer 17, $\sigma$ is line width, and $\gamma_a$ is a short wavelength attenuation coefficient.

The spectroscopic intensity $I(\lambda)$ is then multiplied with the radiance of each wavelength of the light emitted from the light-emitting function layer 10:

$$Le'(\lambda)=I(\lambda)Le(\lambda)$$

is then the final radiance observed at the viewing angle $\theta$.

The chromaticity of each color CIE (x, y) is then given by:

$$x=X/(X+Y+Z)$$

$$y=Y/(X+Y+Z)$$

The trichromatic values X, Y, and Z then become:

$$X = k\int_{380}^{780} Le'(\lambda)\bar{x}(\lambda)d\lambda,$$

$$Y = k\int_{380}^{780} Le'(\lambda)\bar{y}(\lambda)d\lambda,$$

$$Z = k\int_{380}^{780} Le'(\lambda)\bar{z}(\lambda)d\lambda$$

Equation 3

Calculations were performed taking the coefficient k as 5. Further, brightness can be obtained from brightness=Y*683/100.

Final derivations for $Le'(\lambda)$ and CIE(x,y) are obtained from each parameter using these equations. Variations in the chromaticity and radiation intensity and dependence on angle of visibility are then evaluated.

Further, as a comparative example illustrating the effects of the configuration of the present invention, variations in chromaticity and the radiation intensity and dependence on the angle of visibility where also evaluated for the case where the thick-film transparent electrode layer 19 is not provided between the light-emitting function layer 10 and the reflecting metal 20.

Figure 7:
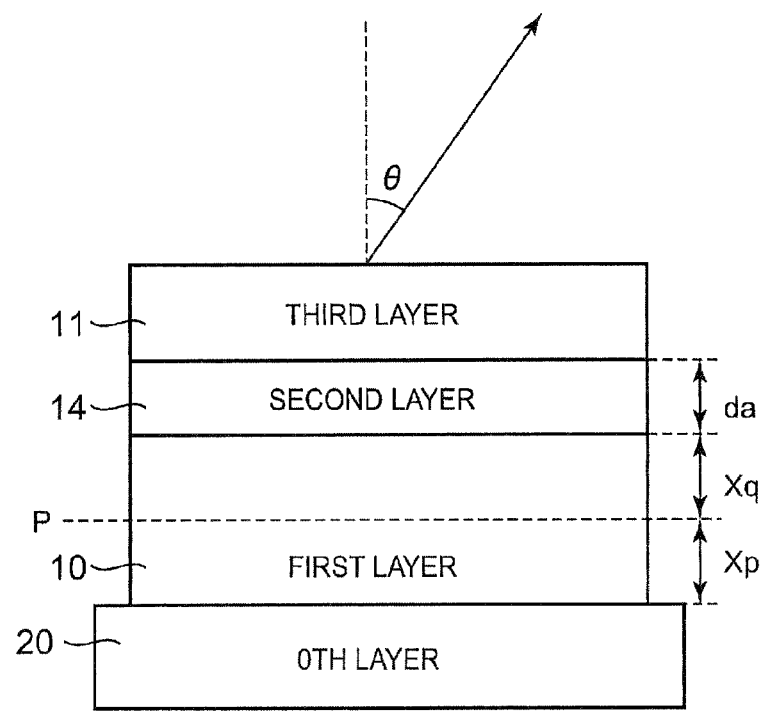
FIG. 7 is a diagram showing a computational model B as a comparative example.

FIG. 7 is a view showing the computational model B when the thick-film transparent electrode layer 19 is not provided, as a comparative example.

Figure 8:
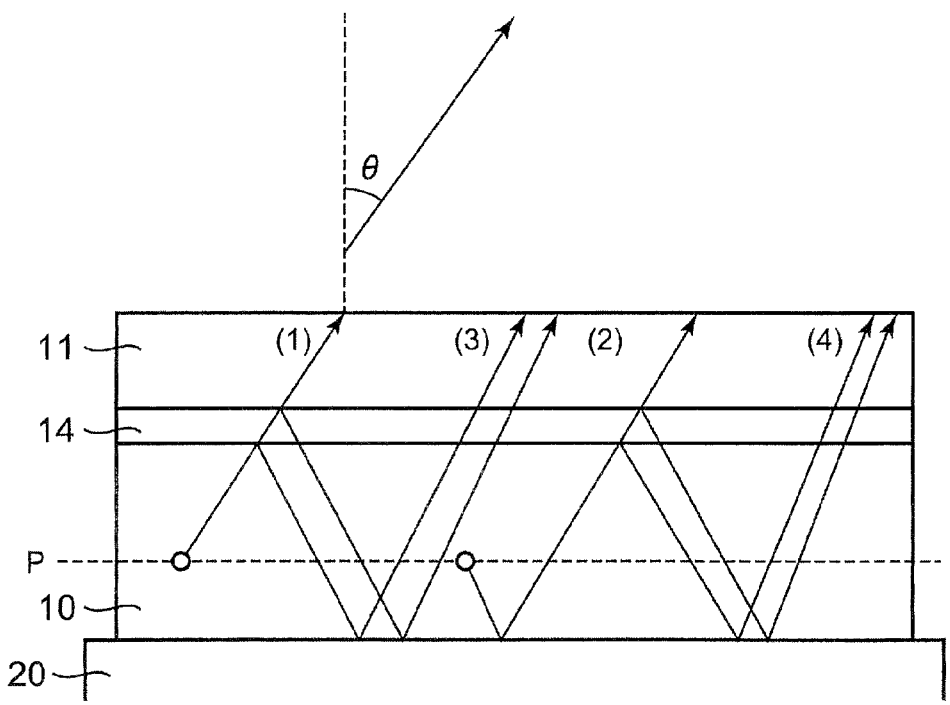
FIG. 8 is a diagram showing a light path of the computational model B as a comparative example.

FIG. 8 is a diagram showing a light path of the computational model B as a comparative example.

In the computational model B also, light emitted by the organic EL is taken to start from one point (radiation point P: one point within the light-emitting layer 17) within the light-emitting function layer 10. Further, in the calculations, a film thickness from the radiation point P to the reflecting metal 20 is taken to be Xp, a film thickness from the radiation point P to the transparent anode electrode 14 is taken to be Xq, a film thickness of the transparent anode electrode 14 is taken to be da, and thickness of the glass substrate 11 is taken to be infinite.

In this case, as shown in FIG. 8, light emitted from the radiation point P of the light-emitting function layer 10 is emitted to outside of the glass substrate 11 via the light paths (1) to (4). The spectroscopic intensity $I(\lambda)$(interference effect) in the direction of the angle $\theta$ of the emitted light can be expressed by the following equation.

$$I(\lambda)=\text{Abs}[\{t_{1,3}\{1-r_{1,0}\exp(i\gamma_p)\}+r_{1,3}r_{1,0}t_{1,3}\exp(i\gamma_{p+q})\}\{1-r_{1,3}\exp(i\gamma_p)\}/\sqrt{2}]^2$$

In the computational model B, the reflecting metal 20 is taken to be the "0th layer", the light-emitting function layer 10 is taken to be the "first layer", the transparent anode electrode 14 is taken to be the "second layer", and the glass substrate 11 is taken to be the "third layer".

Here, this can be expressed by:

$$r_{1,3}=r_{1,2}+t_{1,2}t_{2,1}r_{2,3}\exp(i\gamma_a)$$

$$t_{1,3}=t_{1,2}t_{2,3}\exp(-i\gamma_a/2)$$

Phase difference Y can then be expressed by:

$$\gamma_a=4\pi n_1 da\cos\theta_1/\lambda$$

$$\gamma_p=4\pi n_2 Xp\cos\theta_2/\lambda$$

$$\gamma_{p+q}=4\pi n_2(Xp+Xq)\cos\theta_2/\lambda$$

Next, the interference effects in the computational model A and the computational model B are calculated.

Figure 9:
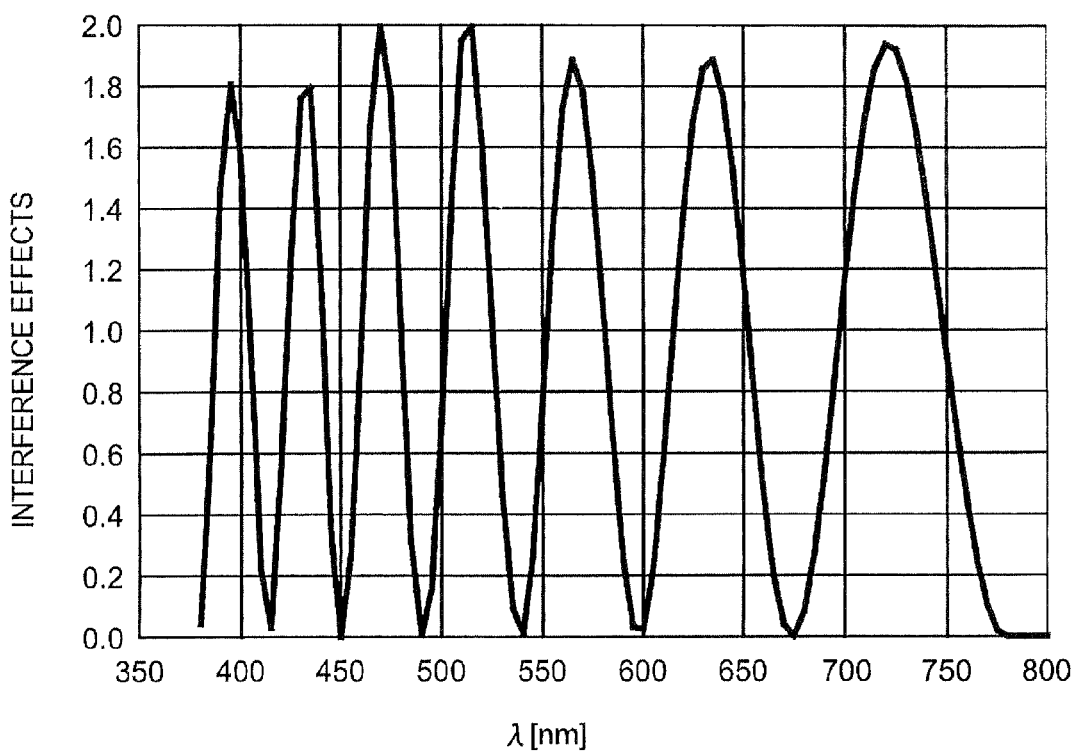
FIG. 9 is a graph showing interference effects in the computational model A of the present invention.

FIG. 9 is a graph showing interference effects in the computational model A provided with the thick-film transparent electrode layer 19 of the present invention.

Figure 10:
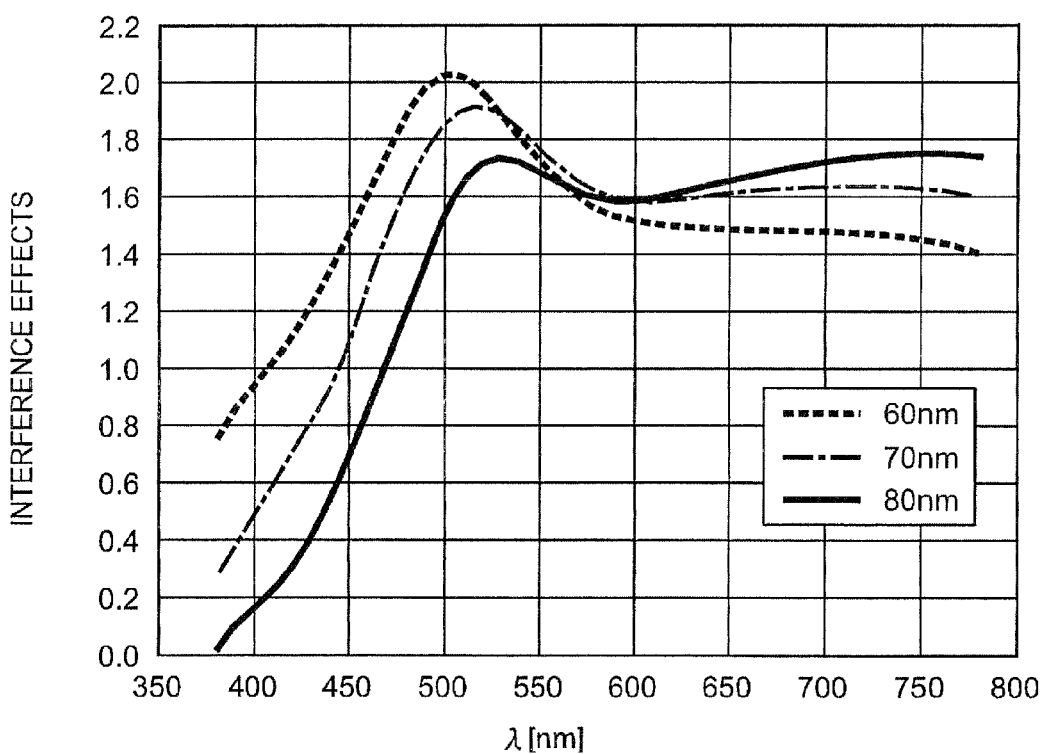
FIG. 10 is a graph showing interference effects in the computational model B taken as a comparative example.

FIG. 10 is a graph showing interference effects in the computational model B where the thick-film transparent electrode layer 19 is not provided as a comparative example, when the film thickness Xp from the radiation point P to the reflecting metal 20 is changed between 60, 70, and 80 nm.

As shown in FIG. 10, in the computational model B where the thick-film transparent electrode layer 19 is not provided, when the value of the film thickness Xp from the radiation point P to the reflecting metal 20 is changed, i.e. when the film thickness of the light-emitting function layer 10 is changed, or when the position of the radiation point P within the light-emitting function layer 10 changes, the peak wavelength of the interference effects changes (shifts), and change in the distribution of the interference effects with respect to wavelength is comparatively large.

On the other hand, the graph of the interference effects in the computational model A shown in FIG. 9 also includes results where the value of the film thickness from the radiation point P to the thick-film transparent electrode layer 19 is changed between 60, 70, and 80 nm as in the case in FIG. 10. However, in this computational model A, values for the interference effects hardly change at all even if the value of the film thickness Xp is changed and can be substantially shown as a single curve.

Namely, in the configuration of the present invention, as shown in FIG. 9, interference effects due to multiple reflections are incurred by providing the thick-film transparent electrode layer 19. Shifts of the peak wavelengths in the interference effects and changes of the wavelength distribution in the interference effects in a case where the film thickness of the light-emitting function layer 10 changes or where the position of the radiation point P within the light-emitting function layer 10 changes then substantially no longer occur, as compared to when the thick-film transparent electrode layer 19 is not provided as shown in FIG. 10. This then gives a period structure where the interference effects have a plurality of peak wavelengths with respect to wavelength as shown in FIG. 9 (referred to as "multiple peak effects"). According to the configuration of the present invention, it is possible to generate a plurality of peak wavelengths for interference results spanning a wavelength range of a broad range. It is then possible to suppress change in intensity of the light emitted to outside due to changing of the film thickness of the light-emitting layer 17 and changing of the position of the radiation point. Further, according to the configuration of the present invention, it is possible to suppress variation in chromaticity and the radiation intensity due to changes in the film thickness of the light-emitting layer 17 and changes in the position of the radiation point, and suppress dependence on the angle of visibility. The details are described in the following.

Figure 11:
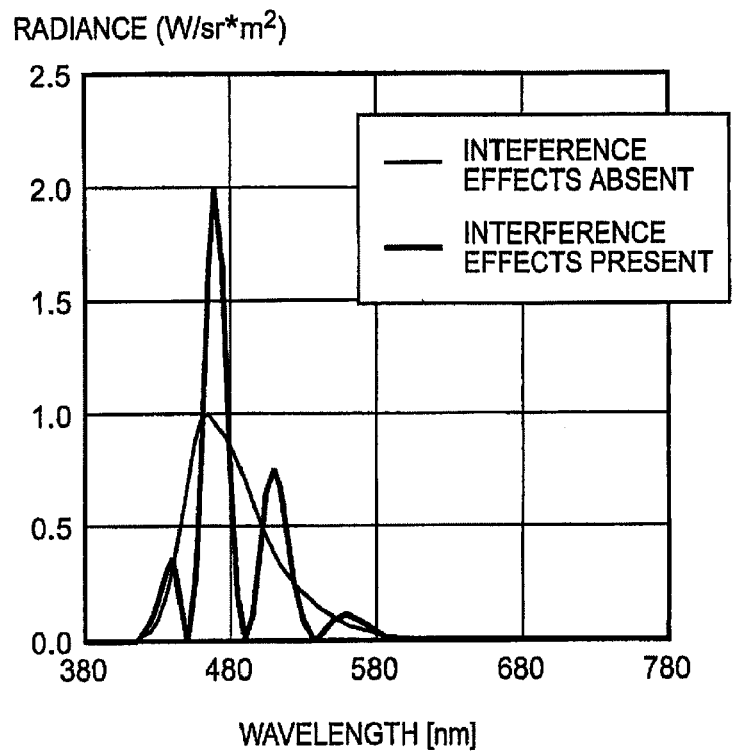
FIG. 11 is a graph showing a comparison of radiance with respect to wavelength in the computational model A of the present invention and radiance with respect to wavelength in the computational model B as a comparative example.

FIG. 11 is a graph showing a comparison of radiance with respect to wavelength in the computational model A where the multiple peak effect is incurred by providing the thick-film transparent electrode layer 19 of the present invention and radiance with respect to wavelength in the computational model B provided as a comparative example where the multiple peak effect is not incurred.

Figure 12:
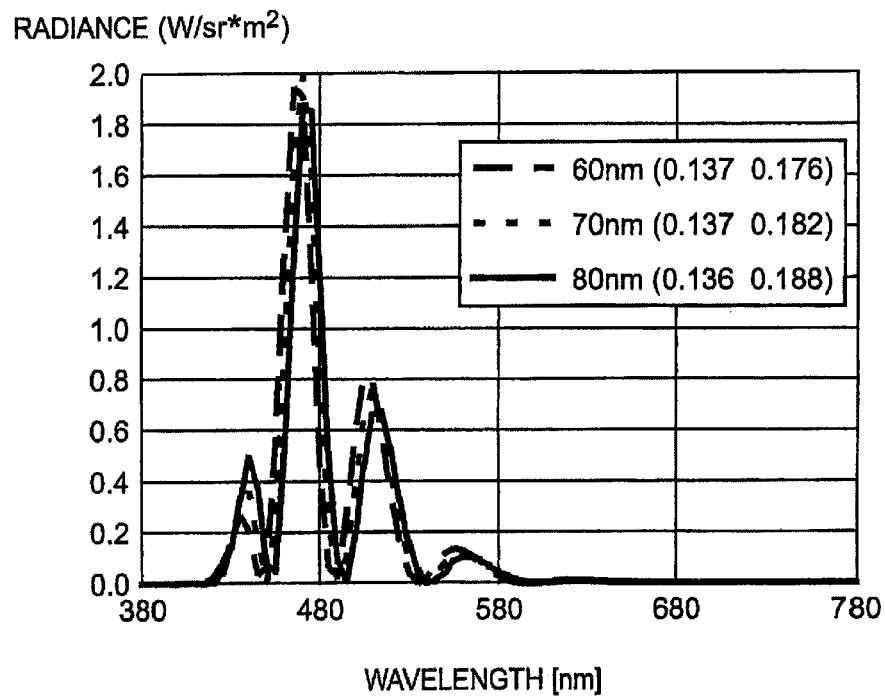
FIG. 12 is a graph showing radiance with respect to wavelength in a computational model A of the present invention.

FIG. 12 is a graph showing radiance with respect to wavelength in a computational model A of the present invention when the film thickness Xp from the radiation point P to the thick-film transparent electrode layer 19 is changed.

Figures 13, 14:
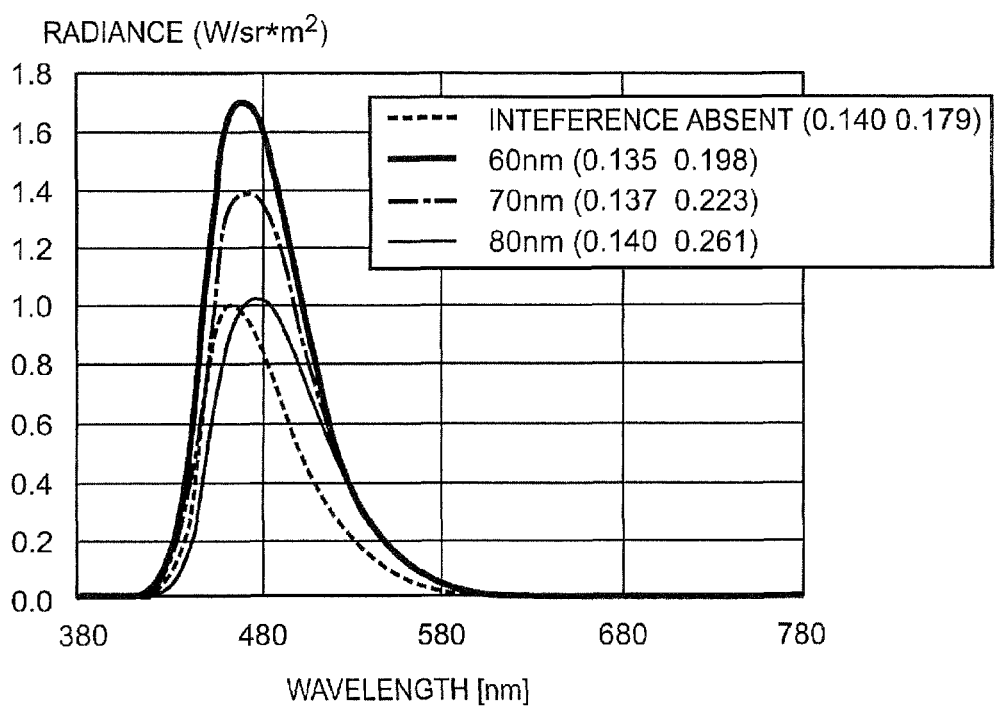
FIG. 13 is a graph showing a peak shift in radiance with respect to wavelength in the computational model B taken as a comparative example.
FIG. 14 is a table showing values for chromaticity of a blue element when a viewing angle θ is changed for the computational model A of the present invention and the computational model B taken as a comparative example.

FIG. 13 is graph showing radiance with respect to wavelength in the computational model B taken as a comparative example when the film thickness Xp from the radiation point P to the reflecting metal 20 is changed.

As shown in FIG. 11, regarding the radiance in the case where the thick-film transparent electrode layer 19 of the computational model B is not provided, the radiance in the case of the configuration of the present invention where the thick-film transparent electrode layer 19 is provided in the computational model A incurs the multiple peak effect due to the thick-film transparent electrode layer 19 being provided and it can be understood that the radiance has a plurality of peak wavelengths.

Comparing FIG. 12 and FIG. 13, as shown in FIG. 13, the radiance when the thick-film transparent electrode layer 19 is not provided in the computational model B, the peak wavelength of the radiance exhibits a tendency to shift to a high-wavelength side (peak shift) as the film thickness Xp increases and exhibits a tendency for the value occurring at the peak wavelength of the radiance to become comparatively large (peak shift). It can therefore be understood that the change in the spectra and chromaticity of light emitted to outside changes comparatively substantially with respect to chance in the film thickness Xp. With regards to this, as shown in FIG. 12, change in each peak wavelength for the radiance when the thick-film transparent electrode layer 19 of the present invention is provided and the multiple peak effect is incurred when the change in the value of the film thickness Xp is slight. Further, the value of the radiance at each peak wavelength hardly changes at all with respect to changes in the value of the film thickness Xp and as shown in FIG. 13, it can be understood that the peak shift hardly changes at all when the value of the film thickness Xp changes. Namely, according to the configuration of the present invention, it is possible to suppress changes in the spectra and chromaticity of light emitted to outside with respect to changes in the film thickness Xp.

It can therefore be confirmed that the multiple peak effect due to the insertion of the thick-film transparent electrode layer 19 brings about the effect of suppressing peak shifts of interference effects due to changes in the film thickness of the light-emitting function layer 10 and peak shifts of radiance due to this effect.

FIG. 14 is a table showing values for chromaticity of a blue element when a viewing angle θ is changed for the computational model A of the present invention and the computational model B taken as a comparative example.

As shown in FIG. 14, with the computational model B for the case where the thick-film transparent electrode layer 19 is not provided taken as a comparative example, reduction in the y-coordinate for a chromaticity CIE (x, y) when the viewing angle θ is changed from 0 degree to 80 degrees is 0.062. With regards to this, in the computational model A where the thick-film transparent electrode layer 19 is provided in the present invention, reduction in the y coordinate of the chromaticity CIE (x, y) when the viewing angle θ is changed from 0 degree to 80 degrees is kept to 0.024. It is therefore possible to confirm that change in chromaticity due to the angle of visibility can also be suppressed by inserting the thick-film transparent electrode layer 19.

Next, a description is given regarding optimum film thickness for the thick-film transparent electrode layer 19 capable of keeping spectral shifting of light emitted to the outside to a minimum in the configuration for the present invention provided with the thick-film transparent electrode layer 19.

The optimum film thickness of the thick-film transparent electrode layer 19 is evaluated using deviation from ideal values for the chromaticity and brightness of blue color elements when the film thickness of the light-emitting function layer 10 is changed. Namely, the film thickness Xp from the radiation point P to the thick-film transparent electrode layer 19 is changed from 35 to 45 nm and the film thickness Xq from the radiation point P to the transparent anode electrode 14 is changed within the range of 60 to 80 nm one nm at a time. 11×21(=231) items of data are then obtained for the respective chromaticities CIE (x, y) and brightness. The closer the average value for this data is to the ideal values, and the more the conditions pertain to a small error, the closer this is to an ideal thin-film where change in color due to the interference effect is small where there is little shift in color when the film thickness changes. The average value for the data and the error are also calculated when the film thickness dc of the thick-film transparent electrode layer 19 changes from 0 to 2000 nm taking the refractive index of the thick-film transparent electrode layer 19 to be the same as the value for the ITO. The error is obtained from the (maximum value−minimum value)/average value, when the film thicknesses Xp and Xq are changed within the range described above and is displayed using (%).

Figure 15:
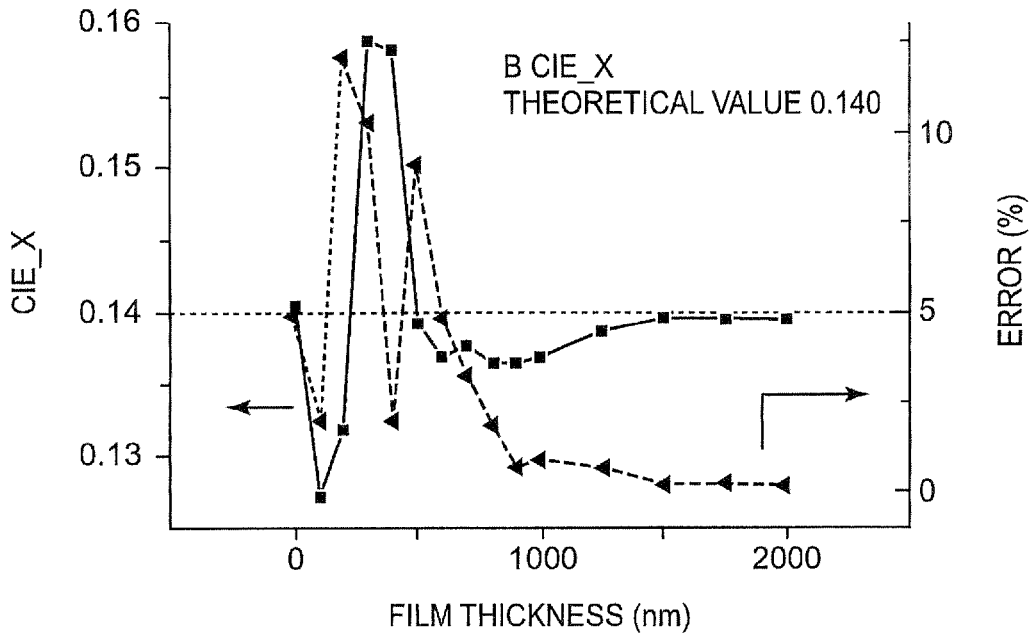
FIG. 15 is a graph showing results of calculating average values and errors for x coordinates for chromaticity when film thickness of a thin-film transparent electrode changes.

FIG. 15 is a graph showing results of calculating average values and errors for x coordinates for chromaticity CIE (x, y) when film thickness of the thick-film transparent electrode layer 19 changes.

Figure 16:
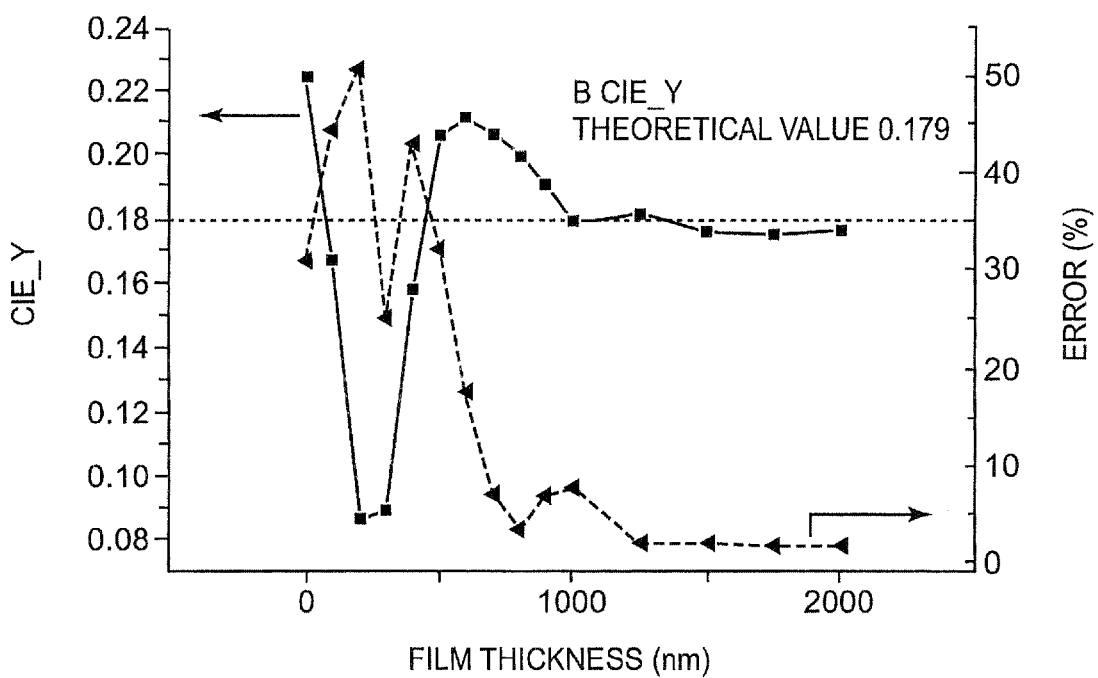
FIG. 16 is a graph showing results of calculating average values and errors for y coordinates for chromaticity when film thickness of a thin-film transparent electrode changes.

FIG. 16 is a graph showing results of calculating average values and errors for y coordinates for chromaticity CIE (x, y) when film thickness of the thick-film transparent electrode layer 19 changes.

As shown in FIG. 15 and FIG. 16, the error for the chromaticity CIE (x, y) is a maximum when the film thickness of the thick-film transparent electrode layer 19 is 200 nm for both the x and y coordinates. The error then gradually falls for a film thickness of 500 nm onwards, and tends to converge on a roughly fixed value for a film thickness of 1000 nm or more.

Further, the average value for the chromaticity CIE (x, y) converges roughly in the vicinity of the ideal value at the x-coordinates for 1200 nm or more and converges in the vicinity of roughly an ideal value for 1000 nm or more for the y-coordinates.

It is therefore preferable for the ideal film thickness for the thick-film transparent electrode layer 19 to be roughly 1000 nm or thicker in order to make the error for the chromaticity small to suppress inconsistency in the chromaticity.

From the results shown in FIG. 15 and FIG. 16, if the film thickness for the thick-film transparent electrode layer 19 is greater than around 800 nm, then substantially the same results can be anticipated. The film thickness of the thick-film transparent electrode layer 19 is therefore roughly 800 nm or thicker.

A method of forming a film by sputtering within a vacuum is preferably applicable as the method for forming the thick-film transparent electrode layer 19. In this event, the time required to form a film becomes longer as the film thickness of the thick-film transparent electrode layer 19 becomes thicker. When the film thickness of the thick-film transparent electrode layer 19 becomes extremely thick, the film-forming times becomes dramatically longer. Manufacture of the light-emitting device 1 therefore becomes time-consuming and productivity falls. Further, transparency gradually falls as the film thickness of the thick-film transparent electrode layer 19 becomes thicker. The amount of light reflected by the reflecting metal 20 therefore falls and it is feared that the quantity of light emitted to outside will also fall. It is therefore preferable for the film thickness of the thick-film transparent electrode layer 19 to be kept down to up to roughly the order of 1500 nm.

Next, a description is given of a method for manufacturing the light-emitting device 1 of the above configuration.

Figure 17A:
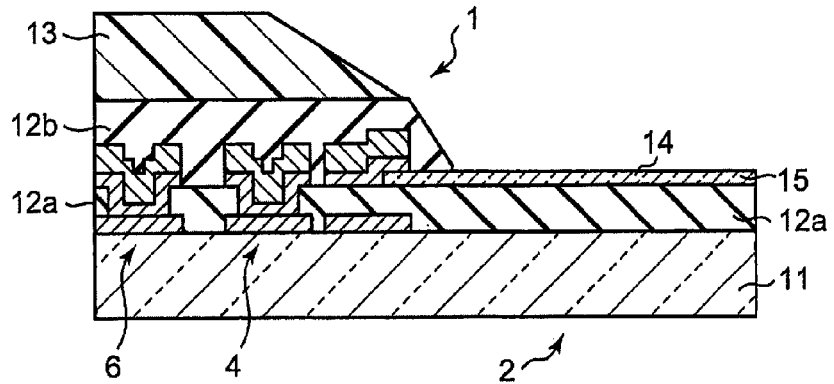
FIGS. 17A to 17C are diagrams showing cross-sectional views illustrating a method for manufacturing a light-emitting device.
Figure 17B:
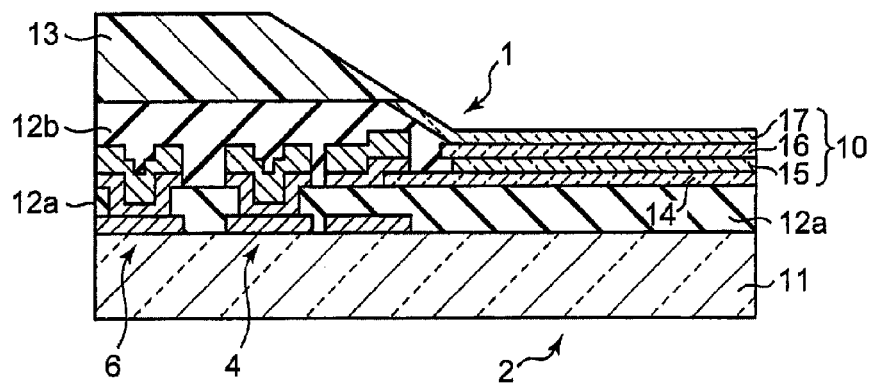
Figure 17C:
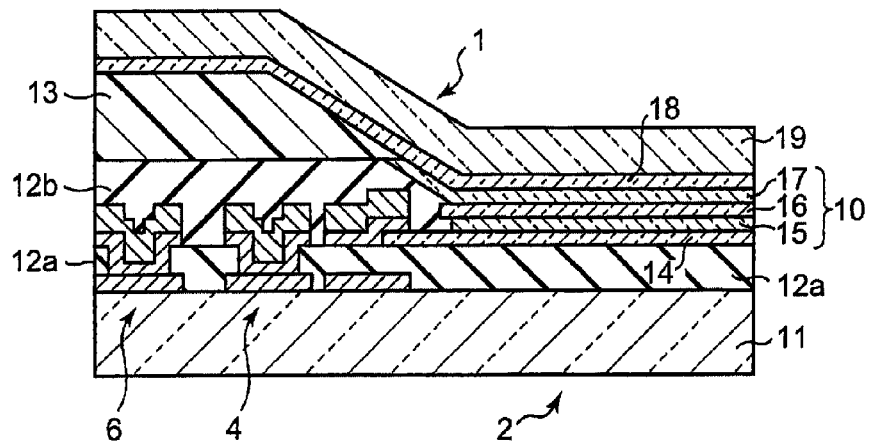

FIGS. 17A to 17C are diagrams showing cross-sectional structures illustrating a method for manufacturing the light-emitting device 1 of this embodiment.

First, wiring layers for the transistors T1 to T3 of the pixel drive circuits 7, the anode lines 4, the data lines 5, and the select lines 6 are formed each pixel forming region on the glass substrate 11 and the transparent anode electrode 14 is formed using the same procedure as for a method for manufacturing a typical TFT substrate.

Namely, for example, a gate metal layer of AlNdTi is formed on the glass substrate 11. The data lines 5 and the gate electrodes for the transistors $T_1$ to $T_3$ of the pixel drive circuits 7 are then formed at the same time using patterning.

The insulating film 12a (gate insulating film) of SiN is then formed on the entire surface of the glass substrate 11. The transparent anode electrode 14 of ITO is then formed on the pixel regions on the glass substrate 11. Prescribed regions of the insulating film 12a formed are then patterned and holes are formed. The select lines 6/anode lines 4 of AlTi/Cr or AlNdTi/Cr are then formed in the formed holes and source/drain electrodes of AlTi/Cr or AlNdTi/Cr are then formed.

Next, the SiN insulating film (inter-layer insulating film) 12b is formed so as to cover the select lines 6 and the anode lines 4.

The insulating film 12b formed on the transparent anode electrode 14 is then removed by, for example, dry etching and the upper surface of the transparent anode electrode 14 is exposed.

The bank layer 13 of polyimide resin is then formed on the insulating film 12b using the same procedure.

After the glass substrate 11 is then washed using pure water, for example, the substrate is subjected to, for example, oxide plasma processing or UV ozone processing. The upper surface of the transparent anode electrode 14 and the wall surfaces of the insulating film 12b are then subjected to lyophilic processing. After washing the substrate 11 with a liquid-repellent solvent such as fluorine, the substrate is washed using alcohol or pure water, dried, and the surface of the bank layer 13 is subjected to liquid-repelling processing. The state shown in FIG. 17A is therefore attained as a result.

Next, as shown in FIG. 17B, after a prescribed solution or dispersion fluid is applied to openings (pixel regions) of the insulating film 12b using ink jet techniques or nozzle coating techniques, drying by heating takes place, and the light-emitting function layer 10 of the hole injection layer 15, the inter-layer 16, and the light-emitting layer 17 is formed at the pixel regions.

For example, after applying dispersion fluid where PEDOT is dispersed in a water-based solvent onto the transparent anode electrode 14, the stage the substrate 11 is mounted on is heated and dried in temperature conditions of one hundred degrees centigrade or more. Residual solvent is then removed so that the hole injection layer 15 is formed on the pixel region.

A solution (dispersion fluid) for the material forming the inter-layer 16 is then applied, heated, and dried using the same procedure so that the inter-layer 16 is formed on the hole injection layer 15.

A solution (dispersion fluid) for the material forming the light-emitting layer 17, for example, a solution (dispersion fluid) that is a light-emitting material including a conjugated double-bond polymer such as polyparaphenylene vinyl dissolved (or dispersed) in an appropriate water-based solvent or organic solvent such as xylene is then applied, heated, and dried using the same procedure so as to form the light-emitting layer 17 on the inter-layer 16.

As shown in FIG. 17C, for example, the substrate 11 is installed in a vacuum chamber. Ca is then vapor-deposited on the entire surface of the substrate and the electron transporting layer 18 is formed on the light-emitting layer 17 and the bank layer 13.

Next, an ITO film is formed on the entire surface of the substrate using sputtering techniques and the thick-film transparent electrode layer 19 is formed on the electron transporting layer 18. An Al layer is then formed using sputtering techniques or vapor deposition on the entire surface of the substrate and the reflecting metal 20 is formed on the thick-film transparent electrode layer 19. The light-emitting device 1 shown in FIG. 3 can therefore be made as a result.

As described above, according to this embodiment, the thick-film transparent electrode layer 19 is provided between the light-emitting function layer 10 and the reflecting metal 20. It is therefore possible to suppress variation in the chromaticity and the radiation intensity and to suppress dependence on the angle of visibility.

Second Embodiment

Next, a description is given of a second embodiment of the present invention.

Figure 18:
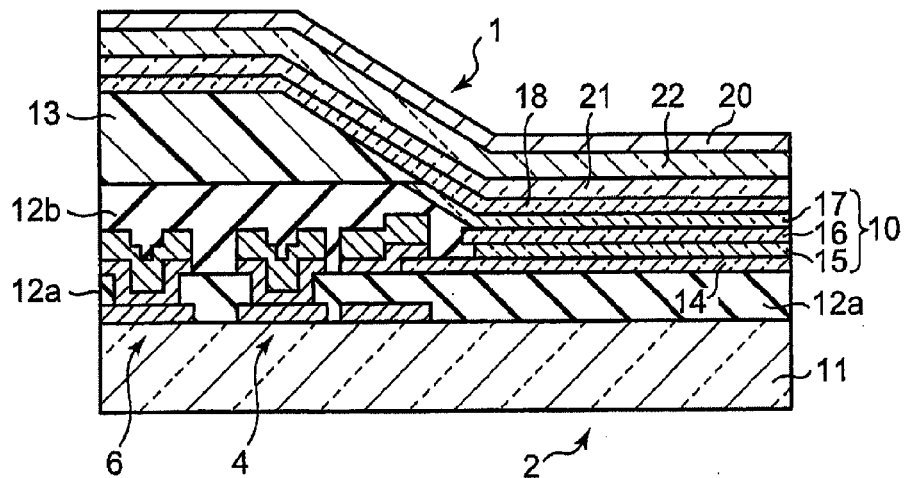
FIG. 18 is a diagram showing a cross-sectional view of a light-emitting device according to a second embodiment of the present invention.

FIG. 18 is a diagram showing a cross-sectional view of a light-emitting device of the second embodiment of the present invention.

In the first embodiment above, the second electrode layer constituting the cathode electrodes of the OLEDs (organic EL elements) provided between the electron transporting layer 18 and the reflecting metal 20 is constituted by the thick-film transparent electrode layer 19 having a single layer structure of conductive material. In the second embodiment, as shown in FIG. 18, the second electrode layer constituting the cathode electrodes of the OLEDs (organic EL elements) provided between the electron transporting layer 18 and the reflecting metal 20 is comprised of a transparent cathode electrode 21 of conductive material and a thick film layer 22. Namely, the second electrode layer has a two-layer structure of the transparent cathode electrode 21 and the thick film layer 22.

In this embodiment, portions that are the same as for the first embodiment are given the same numerals and are not explained.

As shown in FIG. 18, the transparent cathode electrode 21 and the thick film layer 22 are provided between the electron transporting layer 18 and the reflecting metal at the light-emitting device 1 of this embodiment.

The transparent cathode electrode 21 is formed on the electron transporting layer 18. A material having conductivity and being transparent to at least part of a wavelength range of light emitted from the light-emitting function layer 10 is used as the material used in the transparent cathode electrode 21. Specifically, for example, an oxide conduction film such as ITO (Indicum Tin Oxide), Indium Zinc Oxide, Indium Tungsten Oxide, or Indium Tungsten Zinc Oxide) etc. can be used. This transparent cathode electrode 21 functions as a cathode electrode for the OLED (organic EL, element) and the thickness can be of a thickness appropriate for carrying out the role of the cathode electrode.

The thick film layer 22 is formed on the transparent cathode electrode 21, is transparent with respect to light of at least part of the wavelength range of light emitted by the light-emitting function layer 10 and is particularly transparent to light transmitted by the transparent cathode electrode 21. The thick film layer 22 has a function for suppressing variation in the radiation intensity and chromaticity as with the thick-film transparent electrode layer 19 of the first embodiment explained above.

Namely, the thick film layer 22 has a function for suppressing peak shifts in interference effects occurring due to variations in the thickness of the light-emitting function layer 10 and peaks shifts in radiance due to the effects by generating interference peaks across a broad range. As a result, it is possible to suppress variations in chromaticity and the radiation intensity and it is possible to suppress dependence on the angle of visibility.

The thick film layer 22 can also be constituted by a material having insulating properties provided that the material is transparent and can be formed as a film in a vacuum.

The thick film layer 22 can also be made of inorganic material or organic material.

For example, it is preferable to use silicon nitride or silicon oxinitride as the inorganic material constituting the thick film layer 22. This is because the refractive index is close to that of the ITO constituting the transparent cathode electrode 21 (n=1.9) and film forming using CVD or sputtering is straightforward. A thickness of, for example, 800 to 1500 nm is preferable for the thick film layer 22 because when the thick film layer 22 is formed to the same thickness as the ITO, film stress becomes high and there is the possibility that cracks will occur, as well as the film-forming time becoming long.

The organic material constituting the thick film layer 22 is preferably, for example, para-xylene resin, a polyamide resin, or a polyurea resin. In particular, with parylene resin, a resin capable of film forming using a dry process is preferable. The refractive index of these resins is lower than for silicon nitride (n=approximately 1.6) but film forming of a film 1000 nm or more thick is possible at a higher film-forming rate than for a silicon nitride film. However, if the design is such that the film thickness of the thick film layer 22 is greater than 2000 nm, then the effect of suppressing interference will be fixed, and a thickness of 2000 to 7000 nm is preferable so that the time required for film-forming does not become excessively long. Further, when an organic material is used in the thick film layer 22, it is possible for form a film at a faster film-forming rate compared to when an inorganic material is used.

The inorganic material and the organic material are used as a passivation film for organic EL panels because permeability to moisture is low. This means that not only the effect of suppressing shifts due to interference but also passivation effects can be implemented at the same time.

Next, a description is given of a method for manufacturing the light-emitting device 1 of the above configuration.

Figure 19A:
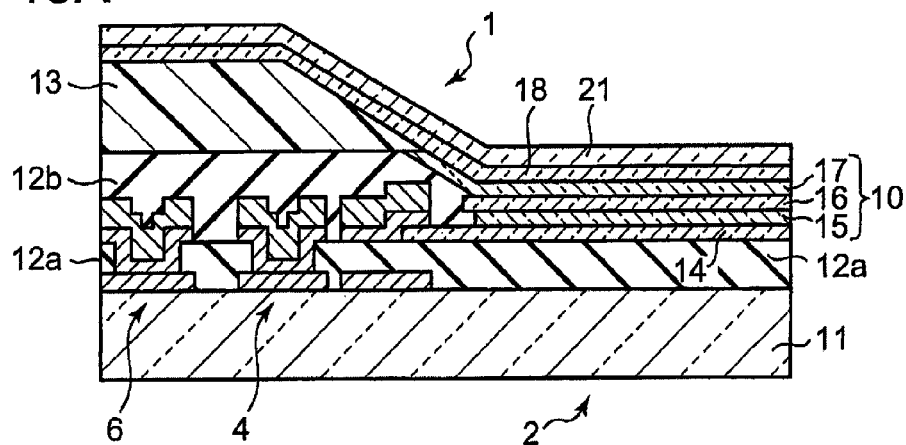
FIGS. 19A and 19B are diagrams showing cross-sectional structures illustrating a method for manufacturing a light-emitting device of FIG. 18.
Figure 19B:
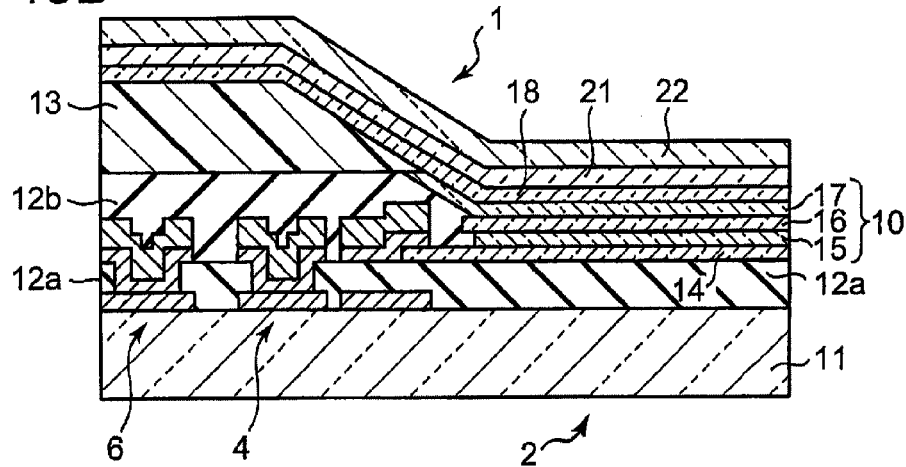

FIGS. 19A and 19B are diagrams showing cross-sectional structures illustrating a method for manufacturing the light-emitting device 1 of FIG. 18.

First, the transistors T1 to T3 of the pixel drive circuit 7, the anode lines 4, the data lines 5, the select lines 6, the insulating film 12a, the transparent anode electrode 14, the insulating film 12b, the bank layer 13, the hole injection layer 15, the inter-layer 16, the light-emitting layer 17, and the electron transporting layer 18 are formed on the substrate 11 using the same procedure as in the first embodiment.

Next, as shown in FIG. 19A, an ITO film is formed over the whole surface of the substrate using sputtering techniques. The transparent cathode electrode 21 is then formed on the electron transporting layer 18. Here, the thickness of the transparent cathode electrode 21 is different from that of the thick-film transparent electrode layer 19 of the first embodiment but may be a thickness sufficient to perform the role of the cathode electrodes.

As shown in FIG. 19B, for example, a nitride oxide silicon film is formed over the entire surface of the substrate and the thick film layer 22 is formed on the transparent cathode electrode 21.

An Al layer is then formed using sputtering techniques or vapor deposition on the entire surface of the substrate and the reflecting metal 20 is formed on the thick film layer 22. The light-emitting device 1 shown in FIG. 18 can therefore be made as a result.

Next, blue color test elements are made, compared, and examined for the case of having the transparent cathode electrode 21 and the thick film layer 22 and the case of not having the transparent cathode electrode 21 and the thick film layer 22 in order to confirm the results of providing the transparent cathode electrode 21 and the thick film layer 22. A 200 nm ITO film is used at the transparent cathode electrode 21 and an 800 nm SiON film is used at the thick film layer 22. Further, the light-emitting layer 17 is formed by spin-coating and three types of sample of film thicknesses of 50 nm, 70 nm, and 90 nm were prepared by changing rotational speed.

Figure 20:
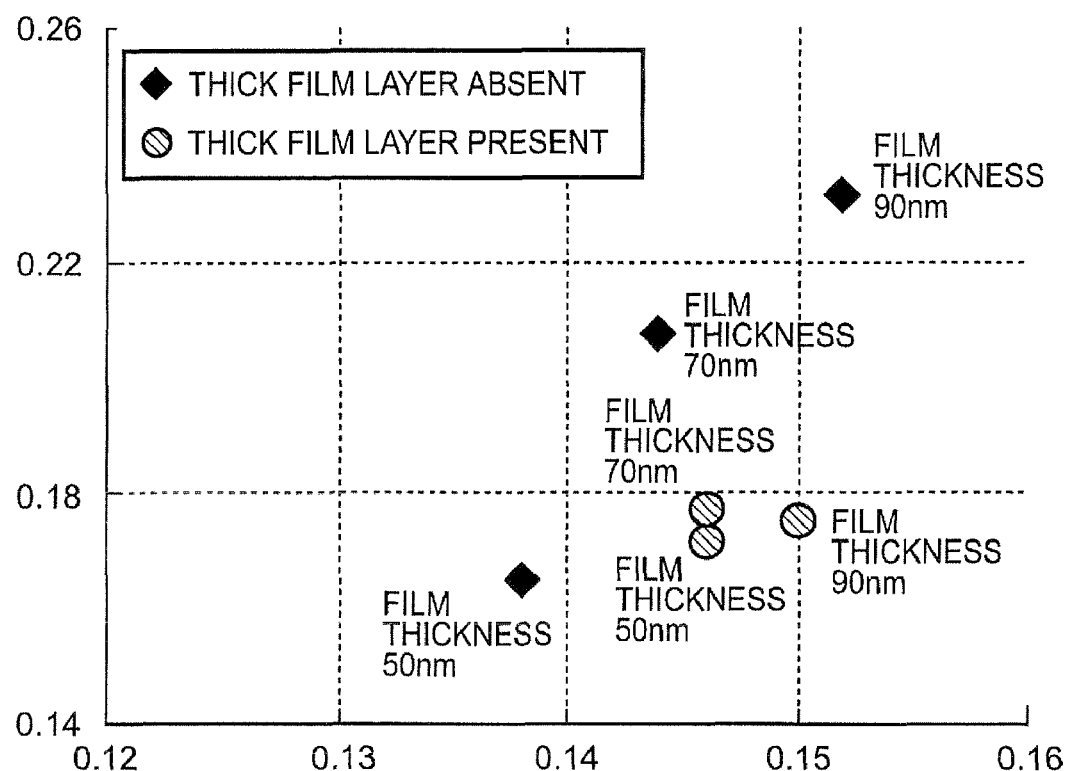
FIG. 20 is a diagram showing change in chromaticity due to changes in film thickness of the light-emitting layer in the second embodiment.

FIG. 20 is a graph showing change in chromaticity due to changes in film thickness of the light-emitting layer 17 for elements made in the second embodiment.

As shown in FIG. 20, it is possible to suppress changes in chromaticity by providing the transparent cathode electrode 21 and the thick film layer 22. It can therefore be confirmed that it is possible to suppress peak shifts in interference effects occurring due to variation in the thickness of the light-emitting layer 17 by providing the transparent cathode electrode 21 and the thick film layer 22 between the electron transporting layer 18 and the reflecting metal 20.

As described above, according to this embodiment, the transparent cathode electrode 21 and the thick film layer 22 are provided between the light-emitting function layer 10 and the reflecting metal 20. It is therefore possible to suppress variation in the chromaticity and the radiation intensity and to suppress dependence on the angle of visibility.

According to this embodiment, it is possible to suppress growth of dark spots by having the thick film layer 22 play the role of a passivation layer.

Moreover, when an organic material is used in the thick film layer 22, it is possible to form a film at a faster film-forming rate compared to when an inorganic material is used.

The present invention is by no means limited to the above embodiments and various modifications and applications are possible. The following is a description of further embodiments to which the present invention is applicable.

In the above embodiments, a description is given of the present invention taking the example of the case where the hole injection layer 15, the inter-layer 16, the light-emitting layer 17, and the electron transporting layer 18 are provided between the pair of electrodes. However, it is also possible to provide at least a single layer light-emitting layer 17 between a pair of electrodes. Further, for example, it is also possible to use a layer that is a combination of the light-emitting layer 17 and the electron transporting layer 18 using an electron transporting light-emitting material in the light-emitting layer 17. Further, it is also possible to not provide the hole injection layer 15, the inter-layer 16, or the electron transporting layer 18.

In the above embodiment, a description is given of the present invention taking an example of the case where the light-emitting element is an organic EL element. However, the present invention is applicable to various light-emitting elements and is not limited to organic EL elements.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2007-195881 filed on Jul. 27, 2007 and including specification, claims, drawings and summary. The disclosure of the above Japanese Patent Application is incorporated herein by reference in its entirety.

What is claimed is:

1. A light-emitting device having a plurality of pixels, each of the plurality of pixels including a light-emitting element which displays color by emitting light at a wavelength corresponding to one of a plurality of different colors;
    wherein each light-emitting element comprises:
        a light emitting function layer of at least one layer, which emits light in accordance with a supplied current;
        a first electrode layer which comprises conductive material, is provided at a first surface of the light-emitting function layer, and is transparent to at least part of a wavelength range of the light emitted from the light-emitting function layer;
        a second electrode layer which comprises conductive material, is provided at a second surface of the light-emitting function layer so as to face the first electrode layer with the light-emitting function layer therebetween, and is transparent to at least part of the wavelength region of the light emitted from the light-emitting function layer; and
        a reflecting layer which is provided on the second electrode layer with no layer interposed between the reflecting layer and the second electrode layer, and which is reflective to at least part of the wavelength range of the light emitted from the light-emitting function layer;
    wherein the second electrode layer is provided in common to all of the plurality of pixels and comprises a plurality of conducting layers which are stacked;
    wherein the second electrode layer is 800 to 1500 nm thick and has a same film thickness at each of the plurality of pixels; and
    wherein the reflecting layer comprises one of Ag, Al, and AlNdTi.

2. The light-emitting device according to claim 1, wherein the second electrode layer comprises an oxide conduction film comprising one of indium tin oxide, indium zinc oxide, indium tungsten oxide, and indium tungsten zinc oxide.

3. The light-emitting device according to claim 1, wherein the second electrode layer is 1000 to 1500 nm thick.

4. The light-emitting device according to claim 1, further comprising an electron carrier layer provided between the light-emitting function layer of each light-emitting element and the second electrode layer;
    wherein the second electrode layer is formed by sputtering; and
    wherein the electron carrier layer comprises a material having resistance to oxygen used in the sputtering when forming the second electrode layer.

5. The light-emitting device according to claim 1, wherein Ca is used in the electron carrier layer.

6. The light-emitting device according to claim 4, further comprising a plurality of partition walls defining respective forming regions for the plurality of pixels;
    wherein the electron carrier layer, the second electrode layer, and the reflecting layer are provided so as to cover the forming region for each pixel and each partition wall.

* * * * *

UNITED STATES PATENT AND TRADEMARK OFFICE
CERTIFICATE OF CORRECTION

PATENT NO. : 8,174,175 B2  
APPLICATION NO. : 12/179686  
DATED : May 8, 2012  
INVENTOR(S) : Kazuto Yamamoto Page 1 of 1

It is certified that error appears in the above-identified patent and that said Letters Patent is hereby corrected as shown below:

Column 18, Line 47; Claim 5, Line 1:

Change "according to claim 1" to --according to claim 4--.

Signed and Sealed this  
Fourth Day of December, 2012

David J. Kappos  
*Director of the United States Patent and Trademark Office*